(12) United States Patent
Happ et al.

(10) Patent No.: US 7,426,134 B2
(45) Date of Patent: Sep. 16, 2008

(54) SENSE CIRCUIT FOR RESISTIVE MEMORY

(75) Inventors: Thomas Happ, Tarrytown, NY (US);
Matthew J. Breitwisch, Yorktown Heights, NY (US); Hsiang-Lang Lung, Elmsford, NY (US)

(73) Assignee: Infineon Technologies North America, San Jose, CA (US)

( * ) Notice: Subject to any disclaimer, the term of this patent is extended or adjusted under 35 U.S.C. 154(b) by 248 days.

(21) Appl. No.: 11/361,811

(22) Filed: Feb. 24, 2006

(65) Prior Publication Data

US 2007/0201267 A1 Aug. 30, 2007

(51) Int. Cl.
*G11C 11/00* (2006.01)
(52) U.S. Cl. .................. 365/158; 385/171; 385/173
(58) Field of Classification Search ............ 365/163, 365/158, 171, 173
See application file for complete search history.

(56) References Cited

U.S. PATENT DOCUMENTS

| | | | |
|---|---|---|---|
| 6,671,710 B2 * | 12/2003 | Ovshinsky et al. ......... 708/493 |
| 6,813,177 B2 * | 11/2004 | Lowrey et al. ............ 365/148 |
| 6,831,856 B2 | 12/2004 | Pashmakov | |
| 6,859,390 B2 | 2/2005 | Pashmakov | |
| 6,914,255 B2 | 7/2005 | Lowrey | |
| 7,190,607 B2 * | 3/2007 | Cho et al. ................. 365/148 |
| 2004/0057180 A1 | 3/2004 | Pashmakov | |
| 2007/0058425 A1 * | 3/2007 | Cho et al. ................. 365/163 |

* cited by examiner

*Primary Examiner*—Pho M. Luu
(74) *Attorney, Agent, or Firm*—Dicke, Billig & Czaja, PLLC

(57) ABSTRACT

A memory includes a phase-change memory cell and a circuit. The phase-change memory cell can be set to at least three different states including a substantially crystalline state, a substantially amorphous state, and at least one partially crystalline and partially amorphous state. The circuit applies a first voltage across the memory cell to determine whether the memory cell is set at the substantially crystalline state and applies a second voltage across the memory cell to determine whether the memory cell is set at a partially crystalline and partially amorphous state.

24 Claims, 5 Drawing Sheets

US 7,426,134 B2

SENSE CIRCUIT FOR RESISTIVE MEMORY

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase-change memory. Phase-change memory uses a phase-change material in the resistive memory element.

Phase-change memories are based on phase-change materials that exhibit at least two different states. Phase-change material may be used in memory cells to store bits of data. The states of phase-change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase-change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. In any of these methods, controllable heating of the phase-change material causes controllable phase change within the phase-change material.

A phase-change memory including a memory array having a plurality of memory cells that are made of phase-change material may be programmed to store data utilizing the memory states of the phase-change material. One way to read and write data in such a phase-change memory device is to control a current and/or a voltage pulse that is applied to the phase-change material. The level of current and/or voltage generally corresponds to the temperature induced within the phase-change material in each memory cell.

To achieve higher density phase-change memories, a phase-change memory cell can store multiple bits of data. Multi-bit storage in a phase-change memory cell can be achieved by programming the phase-change material to have intermediate resistance values or states. If the phase-change memory cell is programmed to one of three different resistance levels, 1.5 bits of data per cell can be stored. If the phase-change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states.

To program a phase-change memory cell to an intermediate resistance value, the amount of crystalline material coexisting with amorphous material and hence the cell resistance is controlled via a suitable write strategy. When reading an intermediate resistance value of a phase-change memory cell using a typical read operation, there is a risk of read disturb, which causes additional crystallization of the phase-change material. The additional crystallization of the phase-change material may modify the resistance value of the memory cell and corrupt the data stored therein.

SUMMARY

One embodiment of the present invention provides a memory. The memory includes a phase-change memory cell and a circuit. The phase-change memory cell can be set to at least three different states including a substantially crystalline state, a substantially amorphous state, and at least one partially crystalline and partially amorphous state. The circuit applies a first voltage across the memory cell to determine whether the memory cell is set at the substantially crystalline state and applies a second voltage across the memory cell to determine whether the memory cell is set at a partially crystalline and partially amorphous state.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
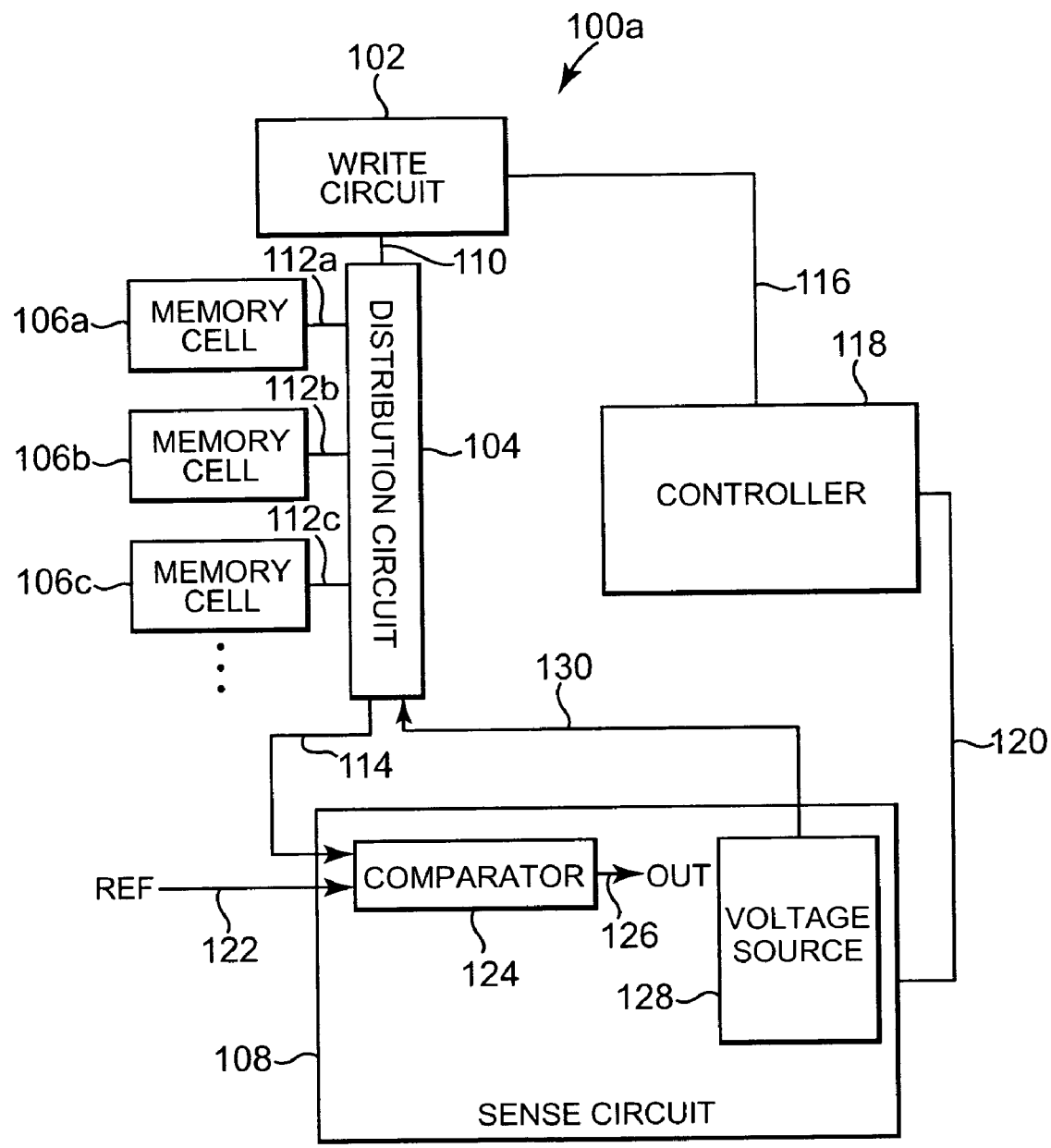
FIG. 1 is a block diagram illustrating one embodiment of a memory device.

FIG. 1 is a block diagram illustrating one embodiment of a memory device 100a. Memory device 100a includes a write circuit 102, a distribution circuit 104, memory cells 106a, 106b, and 106c, a controller 118, and a sense circuit 108. Sense circuit 108 includes a comparator 124 and a voltage source 128. In one embodiment, each of the memory cells 106a-106c is a resistive memory cell, such as a phase-change memory cell that stores data based on the amorphous and crystalline states of phase-change material in the memory cell. Also, each of the memory cells 106a-106c can be programmed into more than two states by programming the phase-change material to have intermediate resistance values. To program one of the memory cells 106a-106c to an intermediate resistance value, the amount of crystalline material coexisting with amorphous material—and hence the cell resistance—is controlled via a suitable write strategy.

Memory device 100a uses a multi-step read process to sense the resistance of a selected memory cell 106a-106c. The multi-step read process avoids read disturb in the selected memory cell. The multi-step process includes applying a selected read voltage across the selected memory cell and sensing a current flowing through the selected memory cell. The sensed current provides a read signal that is compared to a reference signal. The comparison of the read signal to the reference signal provides an indication of the resistance value or state of the selected memory cell. The read voltage is selected such that the current flowing through the selected memory cell in response to the read voltage does not modify the resistance value of the selected memory cell.

Initially, a low read voltage is selected and applied across the selected memory cell. In response to the read voltage, the current flowing through the selected memory cell is sensed to generate a read signal. The read signal is compared to the reference signal to determine whether the selected memory cell is set at the lowest resistance state. If the selected memory cell is not set at the lowest resistance state, the read voltage is increased. The increased read voltage is applied across the selected memory cell and the read signal is again compared to the reference signal to determine whether the selected memory cell is set at the second lowest resistance state. The process repeats until the resistance state of the memory cell is determined.

As used herein, the term "electrically coupled" is not meant to mean that the elements must be directly coupled together and intervening elements may be provided between the "electrically coupled" elements.

Write circuit 102 is electrically coupled to distribution circuit 104 through signal path 110. Distribution circuit 104 is electrically coupled to each of the memory cells 106a-106c through signal paths 112a-112c. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. In addition, distribution circuit 104 is electrically coupled to a first input of comparator 124 through signal path 114 and voltage source 128 through signal path 130. A second input of comparator 124 receives a reference (REF) signal on REF signal path 122. An output of comparator 124 provides an output (OUT) signal on OUT signal path 126. Sense circuit 108 is electrically coupled to controller 118 through signal path 120. Controller 118 is electrically coupled to write circuit 102 through signal path 116.

Each of the memory cells 106a-106c includes a phase-change material that may be changed from an amorphous state to a crystalline state or from a crystalline state to an amorphous state under the influence of temperature change. The amount of crystalline material coexisting with amorphous material in the phase-change material of one of the memory cells 106a-106c thereby defines more than two states for storing data within memory device 100a. In the amorphous state, a phase-change material exhibits significantly higher resistivity than in the crystalline state. Therefore, the more than two states of memory cells 106a-106c differ in their electrical resistivity. In one embodiment, the more than two states can be three states and a trinary system can be used, wherein the three states are assigned bit values of "0", and "2". In one embodiment, the more than two states are four states that can be assigned multi-bit values, such as "00", "01", "10", and "11". In other embodiments, the more than two states can be any suitable number of states in the phase-change material of a memory cell.

Controller 118 controls the operation of write circuit 102 and sense circuit 108. Controller 118 includes a microprocessor, microcontroller, or other suitable logic circuitry for controlling the operation of write circuit 102 and sense circuit 108. Controller 118 controls write circuit 102 for setting the resistance states of memory cells 106a-106c. Controller 118 controls sense circuit 108 for reading the resistance states of memory cells 106a-106c.

Write circuit 102 provides pulses to memory cells 106a-106c and programs one of the more than two resistance levels or states into the phase-change material of each of the memory cells 106a-106c. In one embodiment, write circuit 102 provides voltage pulses to distribution circuit 104 through signal path 110, and distribution circuit 104 controllably directs the voltage pulses to memory cells 106a-106c through signal paths 112a-112c. In one embodiment, distribution circuit 104 includes a plurality of transistors that controllably direct voltage pulses to each of the memory cells 106a-106d. In other embodiments, write circuit 102 provides current pulses to distribution circuit 104 through signal path 110, and distribution circuit 104 controllably directs the current pulses to memory cells 106a-106c through signal paths 112a-112c.

Sense circuit 108 senses the state of the phase-change material and provides signals that indicate the state of the phase-change material in memory cells 106a-106c. Sense circuit 108 reads each of the more than two states of memory cells 106a-106c through signal path 114. Distribution circuit 104 controllably directs read signals between sense circuit 108 and memory cells 106a-106c through signal paths 112a-112c. In one embodiment, distribution circuit 104 includes a plurality of transistors that controllably direct read signals between sense circuit 108 and memory cells 106a-106c.

Voltage source 128 is a variable voltage source controlled by controller 118. Voltage source 128 provides a first voltage across a selected memory cell 106a-106c to sense a first resistance state of the selected memory cell. The first voltage is the lowest voltage provided by voltage source 128 and is used to sense the lowest resistance state of the selected memory cell. Voltage source 128 provides a second voltage across the selected memory cell to sense a second resistance state of the memory cell. The second voltage is greater than the first voltage and is used to sense the second lowest resistance state of the selected memory cell. Voltage source 128 provides a third voltage across the selected memory cell to sense a third or fourth resistance state of the selected memory cell. The third voltage is greater than the second voltage and is used to sense the second highest resistance state and the highest resistance state of the selected memory cell. Voltage source 128 does not provide a voltage greater than the threshold voltage used to change the resistance state of a memory cell.

Comparator 124 receives a read signal from a selected memory cell 106a-106c through distribution circuit 104 on signal path 114 and a reference signal on REF signal path 122 to provide the OUT signal on OUT signal path 126. The reference signal is selected such that the lowest voltage applied by voltage source 128 across a selected memory cell generates a read signal greater than the reference signal to indicate that the selected memory cell is set at the lowest resistance state. In one embodiment, the read signal on signal path 114 is a current signal providing an indication of the state of a selected memory cell 106a-106c and the reference signal on REF signal path 122 is a current signal. In another embodiment, the read signal on signal path 114 is a voltage signal providing an indication of the state of a selected memory cell 106a-106c and the reference signal on REF signal path 122 is a voltage signal. In response to the read signal on signal path 114 being greater than the reference signal on REF signal path 122, comparator 124 outputs a logic high OUT signal on OUT signal path 126. In response to the read signal on signal path 114 being less than the reference signal on REF signal path 122, comparator 124 outputs a logic low OUT signal on OUT signal path 126.

In operation, to read the resistance value of a selected memory cell 106a-106c set to one of four resistance states, controller 118 controls voltage source 128 to apply a first voltage across the selected memory cell 106a-106c. In response to the first voltage, a first read current flows through the selected memory cell 106a-106c. The first read current provides a first read signal. Comparator 124 compares the first read signal on signal path 114 to the reference signal on REF signal path 122. If the first read signal is greater than the reference signal, comparator 124 outputs a logic high OUT signal on OUT signal path 126. The logic high OUT signal indicates that the selected memory cell is set at the lowest resistance state. If the first read signal is less than the reference signal, comparator 124 outputs a logic low OUT signal on OUT signal path 126. The logic low OUT signal indicates that the selected memory cell is not set at the lowest resistance state.

In response to a logic low OUT signal on OUT signal path 126, controller 118 controls voltage source 128 to apply a second voltage across the selected memory cell. The second voltage is greater than the first voltage. In response to the second voltage, a second read current flows through the selected memory cell. The second read current provides a second read signal. Comparator 124 compares the second read signal on signal path 114 to the reference signal on REF signal path 122. If the second read signal is greater than the reference signal, comparator 124 outputs a logic high OUT signal on OUT signal path 126. The logic high OUT signal indicates that the selected memory cell is set at the second lowest resistance state. If the second read signal is less than the reference signal, comparator 124 outputs a logic low OUT signal on OUT signal path 126. The logic low OUT signal indicates that the selected memory cell is not set at the second lowest resistance state.

In response to a logic low OUT signal on OUT signal path 126, controller 118 controls voltage source 128 to apply a third voltage across the selected memory cell. The third voltage is greater than the second voltage. In response to the third voltage, a third read current flows through the selected memory cell. The third read current provides a third read signal. Comparator 124 compares the third read signal on signal path 114 to the reference signal on REF signal path 122. If the third read signal is greater than the reference signal, comparator 124 outputs a logic high OUT signal on OUT signal path 126. The logic high OUT signal indicates that the selected memory cell is set at the second highest resistance state. If the third read signal is less than the reference signal, comparator 124 outputs a logic low OUT signal on OUT signal path 126. The logic low OUT signal indicates that the selected memory cell is set at the highest resistance state. In another embodiment, additional voltages can be provided by voltage source 128 to sense additional resistance states for memory cells that are set to one of more than four resistance states.

Figure 2:
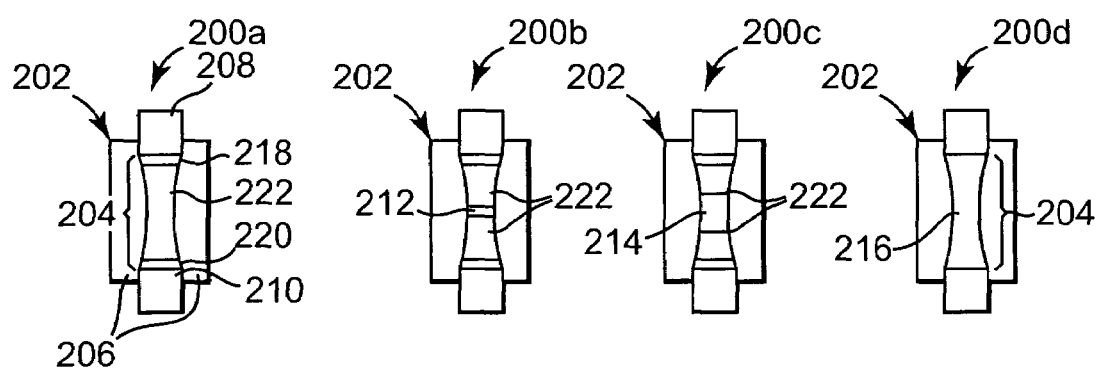
FIG. 2 is a diagram illustrating one embodiment of a memory cell in four different states.

FIG. 2 is a diagram illustrating one embodiment of a memory cell 202 in four different states at 200a, 200b, 200c, and 200d. Memory cell 202 includes a phase-change material 204 that is situated in insulation material 206. Phase-change material 204 is an elongated strip of material that is thinner in the middle and wider at the ends. Insulation material 206 is rectangular shaped. In other embodiments, memory cell 202 can have any suitable geometry including phase-change material 204 in any suitable geometry and insulation material 206 in any suitable geometry.

Phase-change material 204 is electrically coupled at one end to a first electrode 208 and at the other end to a second electrode 210. Pulses are provided to memory cell 202 via first electrode 208 and second electrode 210. The current path through phase-change material 204 is from one of the first electrode 208 and second electrode 210 to the other one of the first electrode 208 and second electrode 210. In one embodiment, each of the memory cells 106a-106c is similar to memory cell 202. Memory cell 202 provides a storage location for storing bits of data.

Insulation material 206 can be any suitable insulator, such as $SiO_2$, fluorinated silica glass (FSG), or doped boro-phosphorous silicate glass (BPSG). First electrode 208 and second electrode 210 can be any suitable electrode material, such as TiN, TaN, W, Al, or Cu.

Phase-change material 204 may be made up of a variety of materials in accordance with the present invention. Generally, chalcogenide alloys that contain one or more elements from group VI of the periodic table are useful as such materials. In one embodiment, phase-change material 204 of memory cell 202 is made up of a chalcogenide compound material, such as GeSbTe, SbTe, GeTe, or AgInSbTe. In another embodiment, the phase-change material is chalcogen free, such as GeSb, GaSb, InSb, or GeGaInSb. In other embodiments, the phase-change material is made up of any suitable material including one or more of the elements Ge, Sb, Te, Ga, As, In, Se, and S.

Phase-change material 204 is programmed into one of four states to store two bits of data. A selection device, such as an active device like a transistor or diode, is coupled to first electrode 208 to control the application of pulses to phase-change material 204. The pulses reset phase-change material 204 and program one of the other three states into phase-change material 204. At 200b, a small middle region 212 of phase-change material 204 has been programmed to change the resistance through phase-change material 204 and memory cell 202. At 200c, a medium sized middle region 214 of phase-change material 204 has been programmed to change the resistance through phase-change material 204 and memory cell 202. At 200d, a large middle region 216, which is substantially all of phase-change material 204, has been programmed to change the resistance through phase-change material 204 and memory cell 202.

The size of the programmed middle region is related to the resistance through phase-change material 204 and memory cell 202. The three different sized middle region states at 200b-200d plus the initial state at 200a provide four states in phase-change material 204, and memory cell 202 provides a storage location for storing two bits of data. In one embodiment, the state of memory cell 202 at 200a is a "00", the state of memory cell 202 at 200b is a "01", the state of memory cell 202 at 200c is a "10", and the state of memory cell 202 at 200d is a "11".

At 200a, phase-change material 204 is reset to a substantially amorphous state. During a reset operation of memory cell 202, a reset pulse is selectively enabled by the selection device and sent through first electrode 208 and phase-change material 204. The reset pulse heats phase-change material 204 above its melting temperature and phase-change material 204 is quickly cooled to achieve the substantially amorphous state at 200a. After a reset operation, phase-change material 204 includes crystalline state phase-change material at 218 and 220, and amorphous state phase-change material at 204. The substantially amorphous state at 200a is the highest resistance state of memory cell 202.

To program phase-change material 204 into one of the other three states 200b-200d, a pulse is provided via a write circuit, such as write circuit 102. At 200b, a pulse is provided to program the small middle region at 212 into a crystalline state. The crystalline state is less resistive than the amorphous state and memory cell 202 at 200b has a lower resistance than memory cell 202 in the substantially amorphous state at 200a. The partially crystalline and partially amorphous state at 200b is the second highest resistance state of memory cell 202.

At 200c, a pulse is provided to program the middle region at 214 into a crystalline state. Since the middle region at 214 is larger than the small middle region at 212 and the crystalline state is less resistive than the amorphous state, memory cell 202 at 200c has a lower resistance than memory cell 202 at 200b and memory cell 202 in the amorphous state at 200a. The partially crystalline and partially amorphous state at 200c is the second lowest resistance state of memory cell 202.

At 200d, a pulse is provided to program the large middle region at 216 into the crystalline state. Since the large middle region at 216 is larger than the middle region at 214 and the crystalline state is less resistive than the amorphous state, memory cell 202 at 200d has a lower resistance than memory cell 202 at 200c, memory cell 202 at 200b, and memory cell 202 in the amorphous state at 200a. The substantially crystalline state at 200d is the lowest resistance state of memory cell 202. In other embodiments, memory cell 202 can be programmed into any suitable number of resistance values or states.

Figure 3:
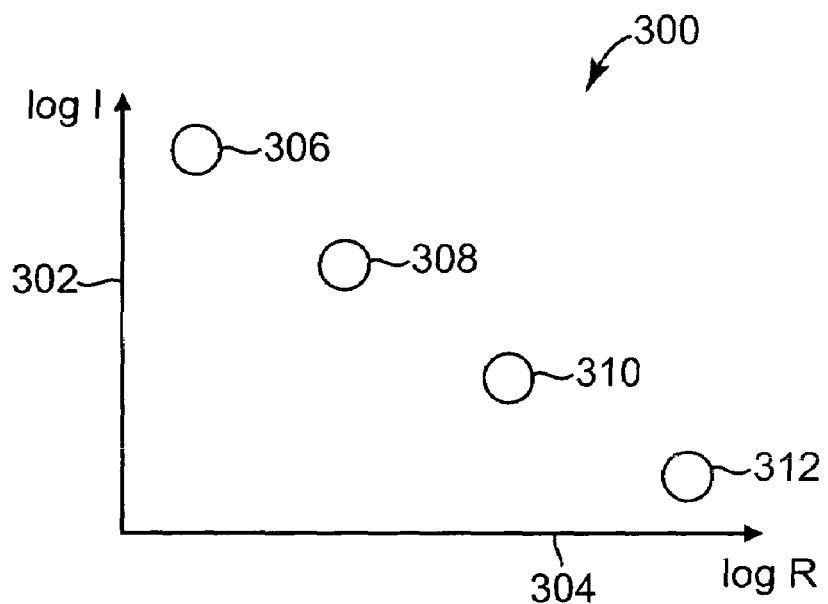
FIG. 3 is a chart illustrating one embodiment of resistance values versus read current for a memory cell in four different states.

FIG. 3 is a chart 300 illustrating one embodiment of resistance values versus read current for a memory cell in four different states. Chart 300 includes the log of the resistance (log R) on x-axis 304 and the log of the current (log I) on y-axis 302. The resistance of a phase-change memory cell set to the lowest resistance state, such as memory cell 202 at 200d, is indicated at 306. The resistance of a phase-change memory cell set to the second lowest resistance state, such as memory cell 202 at 200c, is indicated at 308. The resistance of a phase-change memory cell set to the second highest resistance state, such as memory cell 202 at 200b, is indicated at 310. The resistance of a phase-change memory cell set to the highest resistance state, such as memory cell 202 at 200a, is indicated at 312.

In the lowest resistance state at 306, the phase-change material of the memory cell is substantially crystalline. At the highest resistance state at 312, the phase-change material of the memory cell is substantially amorphous. At intermediate resistance states 308 and 310, both crystalline and amorphous phase-change material is present in the memory cell. These two intermediate resistance states have the highest potential for read disturb during a read operation. Since the sensed read current through a memory cell in the substantially crystalline state at 306 is high, any additional crystallization due to read disturb does not have a great effect on the lowest resistance state. Additional crystallization of a memory cell in the lowest resistance state would act to lower the resistance further. For intermediate resistance states 308 and 310, however, a change in the amount of crystallization may change the resistance value enough to corrupt the data stored within the memory cell.

Figure 4:
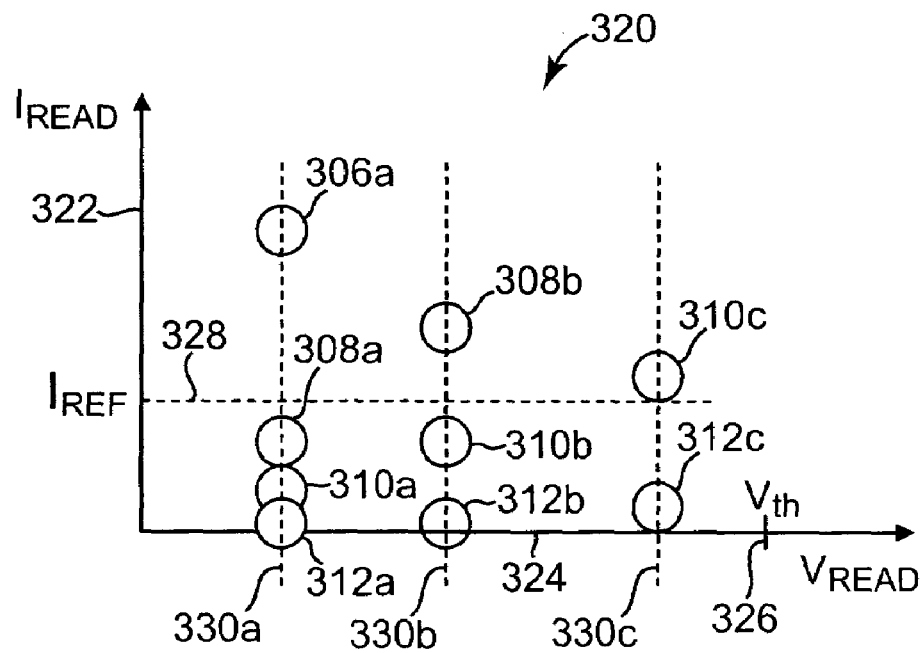
FIG. 4 is a chart illustrating one embodiment of sensing a resistance value of a selected memory cell using a multi-step read process.

FIG. 4 is a chart 320 illustrating one embodiment of sensing a resistance value of a selected memory cell using a multi-step read process. Chart 320 includes the read voltage ($V_{READ}$) on x-axis 324 and the read current ($I_{READ}$) on y-axis 322. The read voltage is iteratively increased depending on the read results to avoid unduly high read currents. In this embodiment, the selected memory cell stores 2-bits and is set to one of four resistance states. In other embodiments, the memory cell can be set to one of more than four resistance states.

To begin the read process, controller 118 controls voltage source 128 to provide a first read voltage as indicated at 330a. The first read voltage at 330a is the lowest read voltage and is applied across the selected memory cell. The current that flows through the selected memory cell in response to the first read voltage is sensed to provide the $I_{READ}$ signal. If the selected memory cell is set at the lowest resistance state, the $I_{READ}$ signal indicated at 306a is sensed from the selected memory cell. If the selected memory cell is set at the second lowest resistance state, the $I_{READ}$ signal indicated at 308a is sensed from the selected memory cell. If the selected memory cell is set at the second highest resistance state, the $I_{READ}$ signal indicated 310a is sensed from the selected memory cell. If the selected memory cell is set at the highest resistance state, the $I_{READ}$ signal indicated at 312a is sensed from the selected memory cell.

Comparator 124 compares the $I_{READ}$ signal on signal path 114 to a reference current ($I_{REF}$) signal on REF signal path 122. If the $I_{READ}$ signal is greater than the $I_{REF}$ signal, then the selected memory cell is determined to be set at the lowest resistance state as indicated at 306a. If the $I_{READ}$ signal is less than the $I_{REF}$ signal, then the selected memory cell is determined to be set at one of the second resistance state as indicated at 308a, the second highest resistance state as indicated at 310a, and the highest resistance state as indicated at 312a.

In response to determining that the selected memory cell is set at the lowest resistance state, the read operation is complete. In response to determining that the selected memory cell is not set at the lowest resistance state, the read operation continues. Controller 118 controls voltage source 128 to provide a second read voltage as indicated at 330b. The second read voltage at 330b is greater than the first read voltage at 330a and is applied across the selected memory cell. The current that flows through the selected memory cell in response to the second read voltage is sensed to provide the $I_{READ}$ signal. If the selected memory cell is set at the second lowest resistance state, the $I_{READ}$ signal indicated at 308b is sensed from the selected memory cell. If the selected memory cell is set at the second highest resistance state, the $I_{READ}$ signal indicated at 310b is sensed from the selected memory cell. If the selected memory cell is set at the highest resistance state, the $I_{READ}$ signal indicated at 312b is sensed from the selected memory cell.

Comparator 124 compares the $I_{READ}$ signal on signal path 114 to the $I_{REF}$ signal on REF signal path 122. If the $I_{READ}$ signal is greater than the $I_{REF}$ signal, then the selected memory cell is determined to be set at the second lowest resistance state as indicated at 308b. If the $I_{READ}$ signal is less than the $I_{REF}$ signal, then the selected memory cell is determined to be set at one of the second highest resistance state as indicated at 310b and the highest resistance state as indicated at 312b.

In response to determining that the selected memory cell is set to the second lowest resistance state, the read operation is complete. In response to determining that the selected memory cell is not set at the second lowest resistance state, the read operation continues. Controller 118 controls voltage source 128 to provide a third read voltage as indicated at 330c. The third read voltage at 330c is greater than the second read voltage at 330b and is applied across the selected memory cell. The current that flows through the selected memory cell in response to the third read voltage is sensed to provide the $I_{READ}$ signal. If the selected memory cell is set at the second highest resistance state, the $I_{READ}$ signal indicated at 310c is sensed from the selected memory cell. If the selected memory cell is set at the highest resistance state, the $I_{READ}$ signal indicated at 312c is sensed from the selected memory cell.

Comparator 124 compares the $I_{READ}$ signal on signal path 114 to the $I_{REF}$ signal on REF signal path 122. If the $I_{READ}$ signal is greater than the $I_{REF}$ signal, then the selected memory cell is determined to be set at the second highest resistance state as indicated at 310c. If the $I_{READ}$ signal is less than the $I_{REF}$ signal, then the selected memory cell is determined to be set at the highest resistance state as indicated at 312c. The first voltage at 330a and the second voltage at 330b are less than the threshold voltage ($V_{th}$) of resistance state 308. The third voltage at 330c is less than the threshold voltage ($V_{th}$) of resistance state 310, as indicated at 326. Therefore, the resistance value of the selected memory cell is not modified during the read process.

In another embodiment, if sense circuit 108 fails to sense a current (i.e., the $I_{READ}$ signal) within a certain time after the read voltage is applied, controller 118 infers that the selected memory cell is set to a higher resistance state. Controller 118 can infer that the selected memory cell is set to a higher resistance state since the higher resistance state of the selected memory cell will draw a current small enough as to provide a lengthened time for sense circuit 108 to sense the signal. If controller 118 infers that the selected memory cell is set to a higher resistance state, the comparison of the $I_{READ}$ signal to the $I_{REF}$ signal can be skipped and the next read voltage can be applied immediately.

Figure 5:
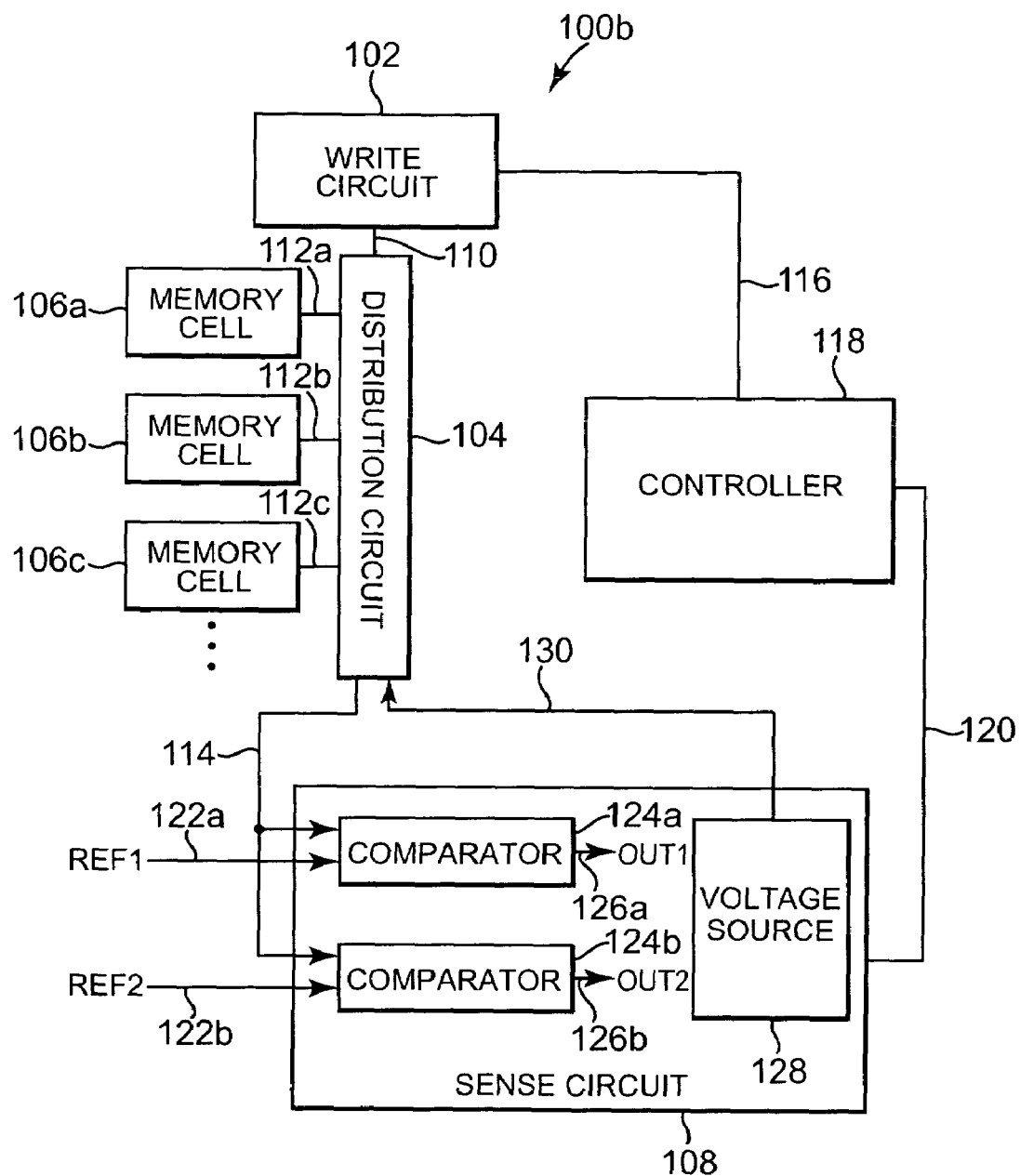
FIG. 5 is a block diagram illustrating another embodiment of a memory device.

FIG. 5 is a block diagram illustrating another embodiment of a memory device 100b. Memory device 100b is similar to memory device 100a previously described and illustrated with reference to FIG. 1, except that memory device 100b includes a sense circuit 108 including a first comparator 124a and a second comparator 124b. Where memory device 100a applies up to three read voltages to the selected memory cell to sense one of four resistance states, memory device 100b applies up to two read voltages to the selected memory cell to sense one of four resistance states.

Distribution circuit 104 is electrically coupled to a first input of first comparator 124a and a first input of second comparator 124b through signal path 114. A second input of first comparator 124a receives a first reference (REF1) signal on REF1 signal path 122a. An output of first comparator 124a provides a first output (OUT1) signal on OUT1 signal path 126a. A second input of second comparator 124a receives a second reference (REF2) signal on REF2 signal path 122b. An output of second comparator 124b provides a second output (OUT2) signal on OUT2 signal path 126b. The second reference signal is lower than the first reference signal. In this embodiment, first comparator 124a and second comparator 124b are used to reduce the number of read voltages applied to the selected memory cell to sense the resistance state of the selected memory cell.

First comparator 124a receives a read signal from a selected memory cell 106a-106c through distribution circuit 104 on signal path 114 and a first reference signal on REF1 signal path 122a to provide the OUT1 signal on OUT1 signal path 126a. The first reference signal is selected such that the lowest voltage provided by voltage source 128 across a selected memory cell generates a read signal greater than the first reference signal to indicate that the selected memory cell is set at the lowest resistance state. In one embodiment, the read signal on signal path 114 is a current signal providing an indication of the state of a selected memory cell 106a-106c and the first reference signal on REF1 signal path 122a is a current signal. In another embodiment, the read signal on signal path 114 is a voltage signal providing an indication of the state of a selected memory cell 106a-106c and the first reference signal on REF1 signal path 122a is a voltage signal. In response to the read signal on signal path 114 being greater than the first reference signal on REF1 signal path 122a, first comparator 124a outputs a logic high OUT1 signal on OUT1 signal path 126a. In response to the read signal on signal path 114 being less than the first reference signal on REF1 signal path 122a, first comparator 124a outputs a logic low OUT1 signal on OUT1 signal path 126a.

Second comparator 124b receives a read signal from a selected memory cell 106a-106c through distribution circuit 104 on signal path 114 and a second reference signal on REF2 signal path 122b to provide the OUT2 signal on OUT2 signal path 126b. The second reference signal is selected such that the lowest voltage provided by voltage source 128 across a selected memory cell generates a read signal greater than the second reference signal and less than the first reference signal to indicate that the selected memory cell is set at the second lowest resistance state. In one embodiment, the read signal on signal path 114 is a current signal providing an indication of the state of a selected memory cell 106a-106c and the second reference signal on REF2 signal path 122b is a current signal. In another embodiment, the read signal on signal path 114 is a voltage signal providing an indication of the state of a selected memory cell 106a-106c and the second reference signal on REF2 signal path 122b is a voltage signal. In response to the read signal on signal path 114 being greater than the second reference signal on REF2 signal path 122b, second comparator 124b outputs a logic high OUT2 signal on OUT2 signal path 126b. In response to the read signal on signal path 114 being less than the second reference signal on REF2 signal path 122b, second comparator 124b outputs a logic low OUT2 signal on OUT2 signal path 126b.

In operation, to read the resistance value of a selected memory cell 106a-106c set to one of four resistance states, controller 118 controls voltage source 128 to apply a first voltage across the selected memory cell 106a-106c. In response to the first voltage, a first read current flows through the selected memory cell 106a-106c. The first read current provides a first read signal. First comparator 124a compares the first read signal on signal path 114 to the first reference signal on REF1 signal path 122a. If the first read signal is greater than the first reference signal, first comparator 124a outputs a logic high OUT1 signal on OUT1 signal path 126a. The logic high OUT1 signal indicates that the selected memory cell is set at the lowest resistance state. If the first read signal is less than the first reference signal, first comparator 124a outputs a logic low OUT1 signal on OUT1 signal path 126a. The logic low OUT1 signal indicates that the selected memory cell is not set at the lowest resistance state.

Second comparator 124b compares the first read signal on signal path 114 to the second reference signal on REF2 signal path 122b. If the first read signal is greater than the second reference signal, second comparator 124b outputs a logic high OUT2 signal on OUT2 signal path 126b. A logic low OUT1 signal and a logic high OUT2 signal indicate that the selected memory cell is set at the second lowest resistance state. If the first read signal is less than the second reference signal, second comparator 124b outputs a logic low OUT2 signal on OUT2 signal path 126b. The logic low OUT2 signal indicates that the selected memory cell is not set at the second lowest resistance state.

In response to a logic low OUT1 signal on OUT1 signal path 126a and a logic low OUT2 signal on OUT2 signal path 126b, controller 118 controls voltage source 128 to apply a second voltage across the selected memory cell. The second voltage is greater than the first voltage. In response to the second voltage, a second read current flows through the selected memory cell. The second read current provides a second read signal. First comparator 124a compares the second read signal on signal path 114 to the first reference signal on REF1 signal path 122a. If the second read signal is greater than the first reference signal, first comparator 124a outputs a logic high OUT1 signal on OUT1 signal path 126a. If the second read signal is less than the first reference signal, first comparator 124a outputs a logic low OUT1 signal on OUT1 signal path 126a.

Second comparator 124b compares the second read signal on signal path 114 to the second reference signal on REF2 signal path 122b. If the second read signal is greater than the second reference signal, second comparator 124b outputs a logic high OUT2 signal on OUT2 signal path 126b. If the second read signal is less than the second reference signal, second comparator 124b outputs a logic low OUT2 signal on OUT2 signal path 126b.

A logic low OUT1 signal and a logic high OUT2 signal indicate that the selected memory cell is set at the second highest resistance state. A logic low OUT2 signal indicates that the selected memory cell is set at the highest resistance state. In another embodiment, additional voltages can be provided by voltage source 128 to sense additional resistance states for memory cells that are set to one of more than four resistance states.

Figure 6:
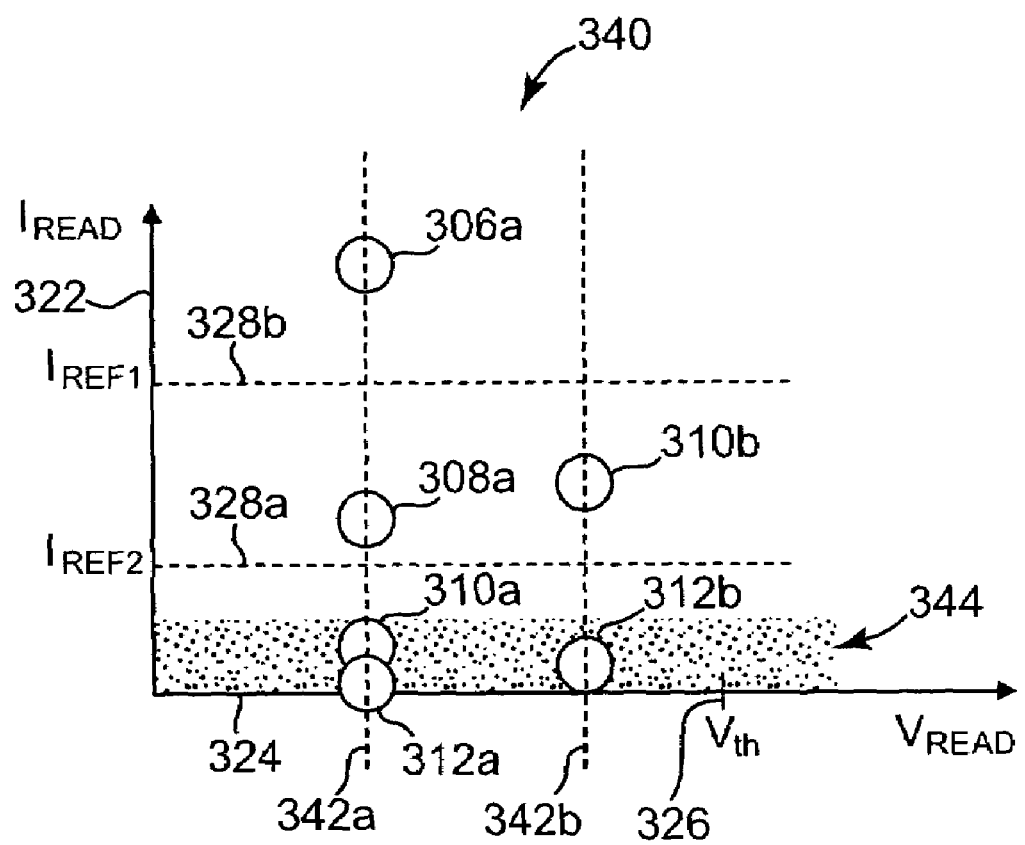
FIG. 6 is a chart illustrating another embodiment of sensing a resistance value of a selected memory cell using a multi-step read process.

FIG. 6 is a chart 340 illustrating another embodiment of sensing a resistance value of a selected memory cell using a multi-step read process. Chart 340 includes the read voltage ($V_{READ}$) on x-axis 324 and the read current ($I_{READ}$) on y-axis 322. The read voltage is iteratively increased depending on the read results to avoid unduly high read currents. In this embodiment, the selected memory cell stores 2-bits and is set to one of four resistance states. In other embodiments, the memory cell can be set to one of more than four resistance states.

To begin the read process, controller 118 controls voltage source 128 to provide a first read voltage as indicated at 342a. The first read voltage at 342a is the lowest read voltage and is applied across the selected memory cell. The current that flows through the selected memory cell in response to the first read voltage is sensed to provide the $I_{READ}$ signal. If the selected memory cell is set at the lowest resistance state, the $I_{READ}$ signal indicated at 306a is sensed from the selected memory cell. If the selected memory cell is set at the second lowest resistance state, the $I_{READ}$ signal indicated at 308a is sensed from the selected memory cell. If the selected memory cell is set at the second highest resistance state, the $I_{READ}$ signal indicated 310a is sensed from the selected memory cell. If the selected memory cell is set at the highest resistance state, the $I_{READ}$ signal indicated at 312a is sensed from the selected memory cell.

First comparator 124a compares the $I_{READ}$ signal on signal path 114 to the first reference current ($I_{REF1}$) signal on REF1 signal path 122a. If the $I_{READ}$ signal is greater than the $I_{REF1}$ signal, then the selected memory cell is determined to be set at the lowest resistance state as indicated at 306a. If the $I_{READ}$ signal is less than the $I_{REF1}$ signal, then the memory cell is determined to be set at one of the second lowest resistance state as indicated at 308a, the second highest resistance state as indicated at 310a, and the highest resistance state as indicated at 312a.

Second comparator 124b compares the $I_{READ}$ signal on signal path 114 to the second reference current ($I_{REF2}$) signal on REF2 signal path 122b. If the $I_{READ}$ signal is greater than the $I_{REF2}$ signal and the $I_{READ}$ signal is less than the $I_{REF1}$ signal (as determined by first comparator 124a), then the selected memory cell is determined to be set at the second highest resistance state as indicated at 308a. If the $I_{READ}$ signal is less than the $I_{REF2}$ signal, then the selected memory cell is determined to be set at one of the second highest resistance state as indicated at 310a and the highest resistance state as indicated at 312a.

In response to determining that the selected memory cell is set at the lowest resistance state or the second lowest resistance state, the read operation is complete. In response to determining that the selected memory cell is not set at the lowest resistance state or the second lowest resistance state, controller 118 controls voltage source 128 to provide a second read voltage as indicated at 342b. The second read voltage at 342b is greater than the first read voltage at 342a and is applied across the selected memory cell. The current that flows through the selected memory cell in response to the second read voltage is sensed to provide the $I_{READ}$ signal. If the selected memory cell is set at the second highest resistance state, the $I_{READ}$ signal indicated at 310b is sensed from the selected memory cell. If the selected memory cell is in the highest resistance state, the $I_{READ}$ signal indicated 312b is sensed from the selected memory cell.

First comparator 124a compares the $I_{READ}$ signal on signal path 114 to the $I_{REF1}$ signal on REF1 signal path 122a. Second comparator 124b compares the $I_{READ}$ signal on signal path 114 to the $I_{REF2}$ signal on REF2 signal path 122b. If the $I_{READ}$ signal is less than the $I_{REF1}$ signal and greater than the $I_{REF2}$ signal, then the selected memory cell is determined to be set at the second highest resistance state as indicated at 310b. If the $I_{READ}$ signal is less than the $I_{REF2}$ signal, then the selected memory cell is determined to be set at the highest resistance state as indicated at 312b. There is a potential noise floor as indicated at 344 below which an accurate $I_{READ}$ signal may not be obtained. Therefore, the $I_{REF2}$ signal should be greater than this potential noise floor.

Embodiments of the present invention provide a multi-step read process for multi-bit phase-change memory cells. The multi-step read process eliminates the potential for read disturb by iteratively increasing the read voltage based on the read results. The read voltage is kept below the threshold voltage of the phase-change material in the memory cells. In addition, the current that flows through a memory cell in response to the read voltage is kept below the critical value that could produce additional crystallization in the memory cell. Therefore, embodiments of the multi-step read process of the present invention prevent data corruption during the read process.

What is claimed is:

1. A memory comprising:
   a phase-change memory cell that can be set to at least three different states including a substantially crystalline state, a substantially amorphous state, and at least one partially crystalline and partially amorphous state; and
   a circuit applying a first voltage across the memory cell to determine whether the memory cell is set at the substantially crystalline state and applying a second voltage across the memory cell to determine whether the memory cell is set at the partially crystalline and partially amorphous state, wherein the circuit comprises a first comparator comparing a first reference signal to a first read signal from the memory cell generated in response to the first voltage and comparing the first reference signal to a second read signal from the memory cell generated in response to the second voltage.

2. The memory of claim 1, wherein the second voltage is greater than the first voltage.

3. The memory of claim 1, wherein the circuit applies the second voltage in response to a determination that the memory cell is not set at the substantially crystalline state.

4. The memory of claim 1, wherein the circuit applies the second voltage in response to not sensing a read signal from the memory cell in response to the first voltage within a certain time.

5. The memory of claim 1, wherein the first reference signal is selected to be:
    less than the first read signal to indicate that the memory cell is set at the substantially crystalline state,
    less than the second read signal to indicate that the memory cell is set at a partially crystalline and partially amorphous state, and
    greater than the second read signal to indicate that the memory cell is set at the substantially amorphous state.

6. The memory of claim 1, wherein the circuit comprises:
    a second comparator comparing a second reference signal to the first read signal and comparing the second reference signal to the second read signal.

7. The memory of claim 6, wherein the first reference signal is selected to be less than the first read signal to indicate that the memory cell is set at the substantially crystalline state; and
    wherein the second reference signal is selected to be:
    less than the first read signal to indicate that the memory cell is set at a first partially crystalline and partially amorphous state,
    less than the second read signal to indicate that the memory cell is set at a second partially crystalline and partially amorphous state, and
    greater than the second read signal to indicate that the memory cell is set at the substantially amorphous state.

8. A memory comprising:
    a resistive memory cell that can be set to at least four resistance values including a first resistance value, a second resistance value greater than the first resistance value, a third resistance value greater than the second resistance value, and a fourth resistance value greater than the third resistance value; and
    a circuit applying a first voltage across the memory cell to determine whether the memory cell is set at the first resistance value or the second resistance value and applying a second voltage across the memory cell to determine whether the memory cell is set at the third resistance value or the fourth resistance value.

9. The memory of claim 8, wherein the resistive memory cell is a phase-change memory cell.

10. The memory of claim 8, wherein the circuit comprises:
    a first comparator comparing a first reference signal to a first read signal from the memory cell generated in response to the first voltage and comparing the first reference signal to a second read signal from the memory cell generated in response to the second voltage; and
    a second comparator comparing a second reference signal to the first read signal and comparing the second reference signal to the second read signal.

11. The memory of claim 10, wherein the first reference signal is less than the first read signal to indicate that the memory cell is set at the first resistance value, and wherein the second reference signal is less than the first read signal to indicate that the memory cell is set at the second resistance value.

12. The memory of claim 10, wherein the second reference signal is less than the second read signal to indicate that the memory cell is set at the third resistance value, and wherein the second reference signal is greater than the second read signal to indicate that the memory cell is set at the fourth resistance value.

13. The memory of claim 8, wherein the circuit applies the second voltage across the memory cell in response to a determination that the memory cell is not set at the first resistance value or the second resistance value.

14. A memory comprising:
    a phase-change memory cell configured to be set to at least three resistance states;
    means for applying a first voltage across the memory cell for determining whether the memory cell is set at a substantially crystalline state and applying a second voltage greater than the first voltage across the memory cell for determining whether the memory cell is set at a substantially amorphous state; and
    means for comparing a reference signal to a read signal from the memory cell generated in response to the first voltage for determining whether the memory cell is set at the substantially crystalline state.

15. A method for sensing the resistance state of a phase-change memory cell, the method comprising:
    applying a first voltage across the memory cell to provide a first read signal;
    comparing a reference signal to the first read signal;
    determining whether the memory cell is set at a first state based on the comparison of the reference signal to the first read signal;
    applying a second voltage greater than the first voltage across the memory cell in response to determining that the memory cell is not set at the first state to provide a second read signal;
    comparing the reference signal to the second read signal; and
    determining whether the memory cell is set at a second state based on the comparison of the reference signal to the second read signal.

16. The method of claim 15, further comprising:
    applying a third voltage greater than the second voltage across the memory cell in response to determining that the memory cell is not set at the second state to provide a third read signal;
    comparing the reference signal to the third read signal; and
    determining whether the memory cell is set at a third state based on the comparison of the reference signal to the third read signal.

17. The method of claim 16, further comprising:
    determining whether the memory cell is set at a fourth state based on the comparison of the reference signal to the third read signal.

18. The method of claim 16, wherein comparing the reference signal to the first read signal comprises comparing a reference current to a first current flowing through the memory cell in response to the first voltage.

19. The method of claim 15, wherein determining whether the memory cell is set at the first state comprises determining whether the memory cell is set at a substantially crystalline state.

20. The method of claim 15, wherein determining whether the memory cell is set at the second state comprises determining whether the memory cell is set at a partially crystalline and partially amorphous state.

21. A method for sensing the resistance state of a phase-change memory cell, the method comprising:

applying a first voltage across the memory cell to provide a first read signal;

comparing a first reference signal to the first read signal to provide a first output signal;

comparing a second reference signal to the first read signal to provide a second output signal;

determining whether the memory cell is set at a first state based on the first output signal;

determining whether the memory cell is set at a second state based on the first output signal and the second output signal;

applying a second voltage greater than the first voltage across the memory cell in response to determining that the memory cell is not set at the first state or the second state to provide a second read signal;

comparing the first reference signal to the second read signal to provide a third output signal;

comparing the second reference signal to the second read signal to provide a fourth output signal;

determining whether the memory cell is set at a third state based on the third output signal and the fourth output signal; and determining whether the memory cell is set at a fourth state based on the third output signal and the fourth output signal.

22. The method of claim 21, wherein comparing the first reference signal to the first read signal comprises comparing a first reference current to a first current flowing through the memory cell in response to the first voltage.

23. The method of claim 21, wherein determining whether the memory cell is set at the first state comprises determining whether the memory cell is set at a substantially crystalline state.

24. The method of claim 21, wherein determining whether the memory cell is set at the second state comprises determining whether the memory cell is set at a partially crystalline and partially amorphous state.

* * * * *